(12) United States Patent
Hwang et al.

(10) Patent No.: US 6,967,849 B1
(45) Date of Patent: Nov. 22, 2005

(54) ONE SYSTEM MODULE FOR ELECTRIC/ELECTRONIC APPLIANCE

(75) Inventors: Min-Kyu Hwang, Kyounggi-do (KR); Jae-Chun Lee, Seoul (KR); Sang-Kyun Lee, Kyounggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/705,759

(22) Filed: Nov. 6, 2000

(30) Foreign Application Priority Data

Dec. 30, 1999 (KR) ................................ 1999-66133

(51) Int. Cl.⁷ ............................................. H05K 7/02
(52) U.S. Cl. ..................................... 361/760; 361/752
(58) Field of Search ................................ 361/773, 774, 361/790, 791, 728, 730, 735, 736, 752, 760, 361/796; 439/76.1, 76.2

(56) References Cited

U.S. PATENT DOCUMENTS

| | | | |
|---|---|---|---|
| 4,558,510 A * | 12/1985 | Tani et al. | 438/127 |
| 4,769,557 A * | 9/1988 | Houf et al. | 307/147 |
| 5,375,040 A * | 12/1994 | Cooper et al. | 361/730 |
| 5,519,252 A * | 5/1996 | Soyano et al. | 257/690 |
| 5,521,437 A * | 5/1996 | Oshima et al. | 257/701 |
| 5,539,253 A * | 7/1996 | Nagaune | 257/687 |
| 5,581,130 A * | 12/1996 | Boucheron | 307/10.1 |
| 5,691,885 A * | 11/1997 | Ward et al. | 361/729 |
| 5,747,875 A * | 5/1998 | Oshima | 257/687 |
| 5,877,944 A * | 3/1999 | Onizuka | 361/826 |
| 5,901,044 A * | 5/1999 | Marro | 174/50 |
| 5,995,380 A * | 11/1999 | Maue et al. | 361/826 |
| 6,000,952 A * | 12/1999 | Gladd et al. | 439/76.2 |
| 6,203,334 B1 * | 3/2001 | Daoud et al. | 439/76.1 |
| 6,224,397 B1 * | 5/2001 | Nakamura | 439/76.2 |
| 6,441,520 B1 * | 8/2002 | Grant | 310/68 R |

* cited by examiner

Primary Examiner—Randy Gibson
Assistant Examiner—Thanh S. Phan
(74) Attorney, Agent, or Firm—Birch Stewart Kolasch & Birch LLP

(57) ABSTRACT

A system module including a case constituting a body of the one system module; power pins and signal pins disposed adjacent to three edges on a surface of the case in a manner such that substantially a U-shaped arrangement is obtained; a power board located inside the case and electrically connected with the power pins; and a signal board located inside the case and electrically connected with the signal pins. At least two corner portions among four corner portions of the case, which two corner portions are opposite to each other in a diagonal direction, are defined with engaging holes, respectively, through which the case and a heat sink are coupled with each other. Connecting pins and inserting holes through which the connecting pins are inserted, respectively, are complementarily formed and defined on and in the power board and the signal board, so as to electrically connect the power board and the signal board with each other.

5 Claims, 3 Drawing Sheets

ONE SYSTEM MODULE FOR ELECTRIC/ELECTRONIC APPLIANCE

BACKGROUND OF THE INVENTION

1. Field of the Invention

The present invention relates to one system module which integrates an inverter and a peripheral circuit with each other which are adopted in an electric/electronic appliance, and more particularly, the present invention relates to one system module for an electric/electronic appliance, in which pins are located adjacent to three edges on a surface of a case, whereby applicability of the one system module to the electric/electronic appliance is improved and a size of the one system module is reduced.

2. Description of the Related Art

FIG. 1 is a perspective view illustrating an outer appearance of the conventional one system module.

As shown in FIG. 1, the conventional one system module 100 includes a case 101 having a rectangular parallelepiped-shaped configuration, and power pins 102 and signal pins 103 which are arranged adjacent to both long edges on an upper surface of the case 101. Here, the power pins 102 includes three phase U, V and W pins for being connected with a motor (not shown) and pins for supplying DC power (for example, DC 310V) which is obtained by rectifying AC power (for example, AC 220V). The signal pins 103 are used for interfacing a microcomputer (micom) and other sensors. In FIG. 1, the drawing reference numeral 101t represents an engaging protrusion where a heat sink (not shown) is attached to the case 101.

FIG. 2 is a block diagram schematically illustrating a structure of a power board which is arranged in the one system module of FIG. 1.

Referring to FIG. 2, the power board 200 comprises a ceramic substrate 201, and a variety of circuit devices and parts which are located on the ceramic substrate 201. In other words, on the ceramic substrate 201, there are located a power device section 202 which are formed by connection between a plurality of (for example, respectively six) insulated gate bipolar transistors (IGBTs) and free wheeling diodes (FWDs), a gate drive (HVIC) 203 for driving the IGBTs, an over-current sensing section 204 for sensing over-current which flows through the IGBTs, an over-temperature sensing section 205 for sensing over-temperature of the IGBTs, a rectifying section 206 for rectifying AC power inputted from the outside to DC power, an power supplier (SMPS) (207) for supplying power to devices in the one system module, and so forth. The power board 200 which is structured as mentioned above, is disposed adjacent to a lower end inside the module.

FIG. 3 is a block diagram schematically illustrating a structure of a signal board which is arranged in the one system module of FIG. 1.

Referring to FIG. 3, the signal board 300 comprises an epoxy substrate 301, and a diversity of circuit devices and parts which are located on the epoxy substrate 301. That is to say, on the epoxy substrate 301, there are located a microcomputer 302 for driving the IGBTs which are installed on the power board 200, a bootstrap circuit 303, a load driving section 304 for driving an optional load (for example, a motor), a microcomputer peripheral circuit 305, and so on. The signal board 300 which is structured as mentioned above, is disposed over and electrically connected to the power board 200.

FIG. 4 is a cross-sectional view taken along the line A-A' of FIG. 1.

As can be readily seen from FIG. 4, the power board 200 is disposed adjacent to a lower end of the case 101 and the signal board 300 is disposed over the power board 200. And, as described above, the power board 200 and the signal board 300 are electrically connected with each other by connection cords 401.

On the other hand, the conventional one system module constructed as mentioned above has a double-layered structure in which the signal board 300 is superposed on the power board 200 inside the case 101. In this double-layered structure, since the power pins 102 and the signal pins 103 are simultaneously arranged adjacent to the same edge on the upper surface of the case 101, a problem is caused in that assemblage is deteriorated when the one system module is applied to an appliance. Further, because all the power pins 102 are arranged adjacent to only one edge on the upper surface of the case 101, an entire size of the one system module is increased.

SUMMARY OF THE INVENTION

Accordingly, the present invention has been made in an effort to solve the problems occurring in the related art, and an object of the present invention is to provide one system module for an electric/electronic appliance, in which pins are located adjacent to three edges on a surface of a case, whereby applicability of the one system module to the electric/electronic appliance is improved and a size of the one system module is reduced.

In order to achieve the above object, according to one aspect of the present invention, there is provided one system module for an electric/electronic appliance, comprising: a case constituting a body of the one system module; power pins and signal pins disposed adjacent to three edges on a surface of the case in a manner such that substantially a U-shaped arrangement is obtained; a power board located inside the case and electrically connected with the power pins; and a signal board located inside the case and electrically connected with the signal pins.

According to another aspect of the present invention, at least two corner portions among four corner portions of the case, which two corner portions are opposite to each other in a diagonal direction, are defined with engaging holes, respectively, through which the case and a heat sink are coupled with each other.

According to still another aspect of the present invention, connecting pins and inserting holes through which the connecting pins are inserted, respectively, are complementarily formed and defined on and in the power board and the signal board, so as to electrically connect the power board and the signal board with each other.

By the features of the present invention, since power pins and signal pins are disposed adjacent to three edges on a surface of a case, other than in the conventional art, an entire size of the one system module can be reduced, and when the one system module is applied to an appliance, assemblability of the appliance is improved.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
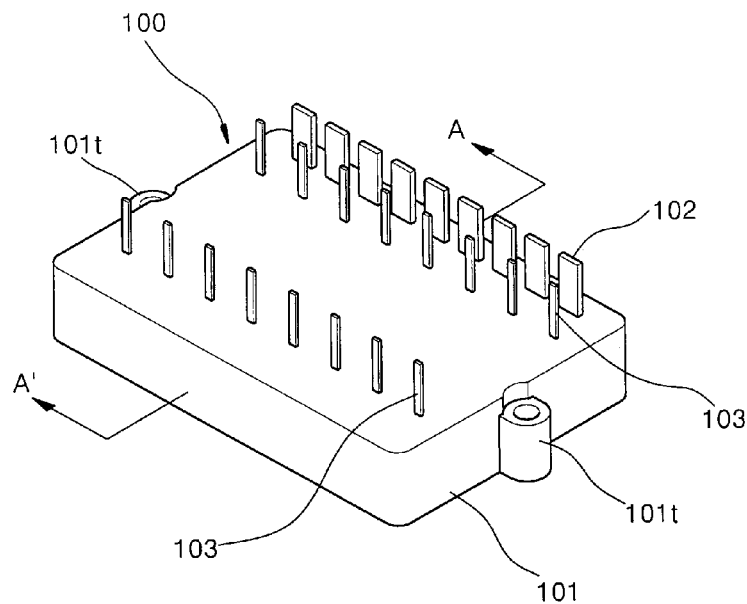
FIG. 1 is a perspective view illustrating an outer appearance of the conventional one system module.
Figure 2:
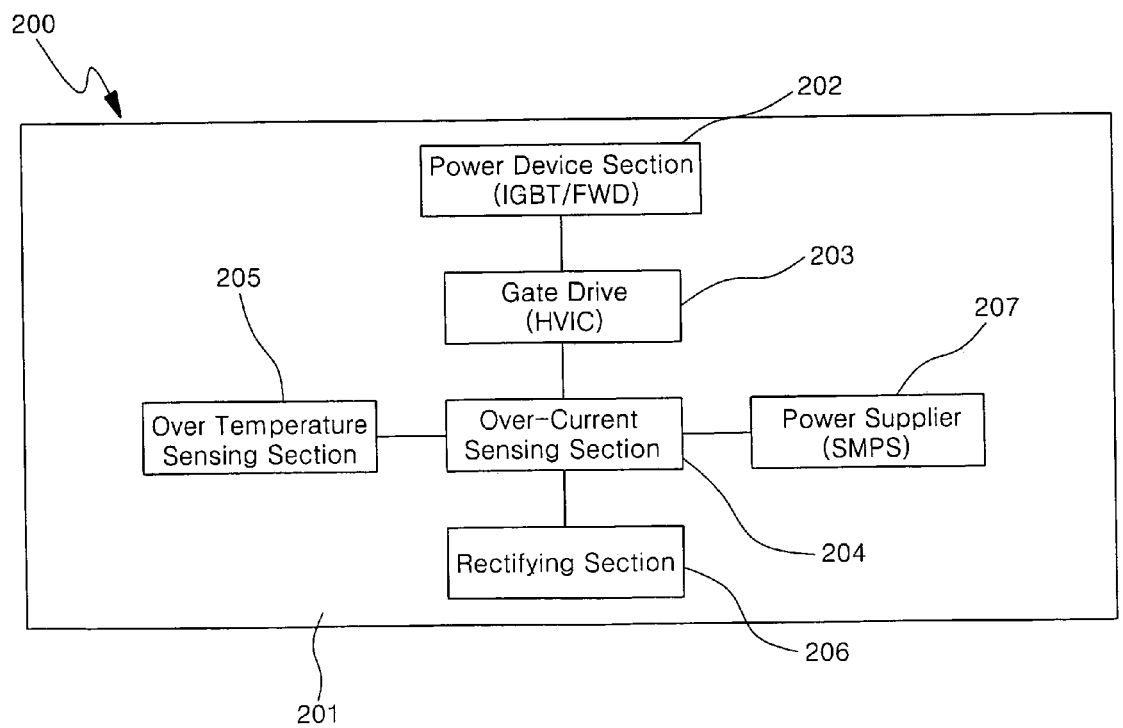
FIG. 2 is a block diagram schematically illustrating a structure of a power board which is arranged in the one system module of FIG. 1.
Figure 3:
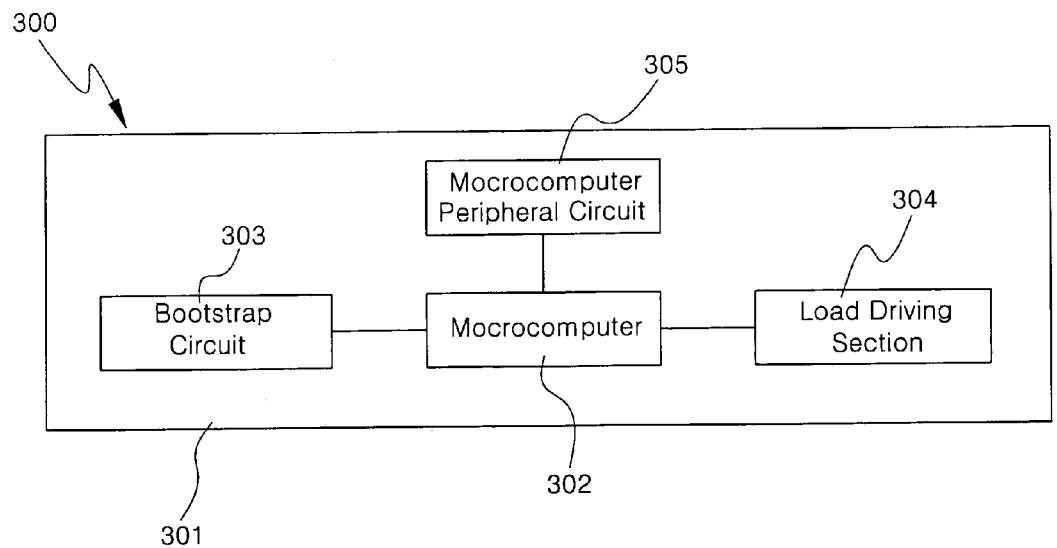
FIG. 3 is a block diagram schematically illustrating a structure of a signal board which is arranged in the one system module of FIG. 1.
Figure 4:
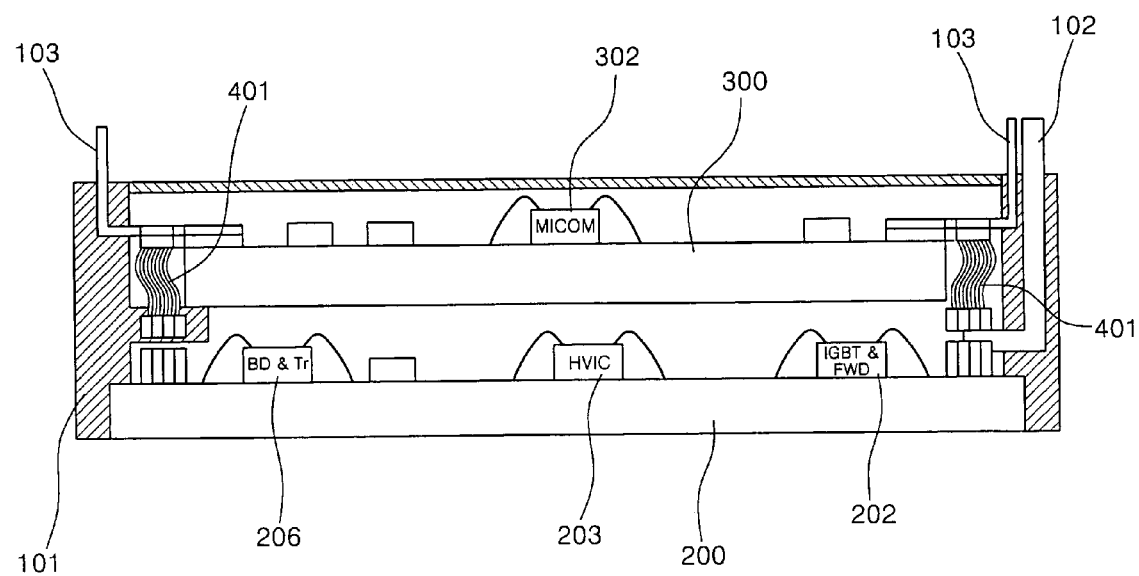
FIG. 4 is a cross-sectional view taken along the line A- A' of FIG. 1.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 5:
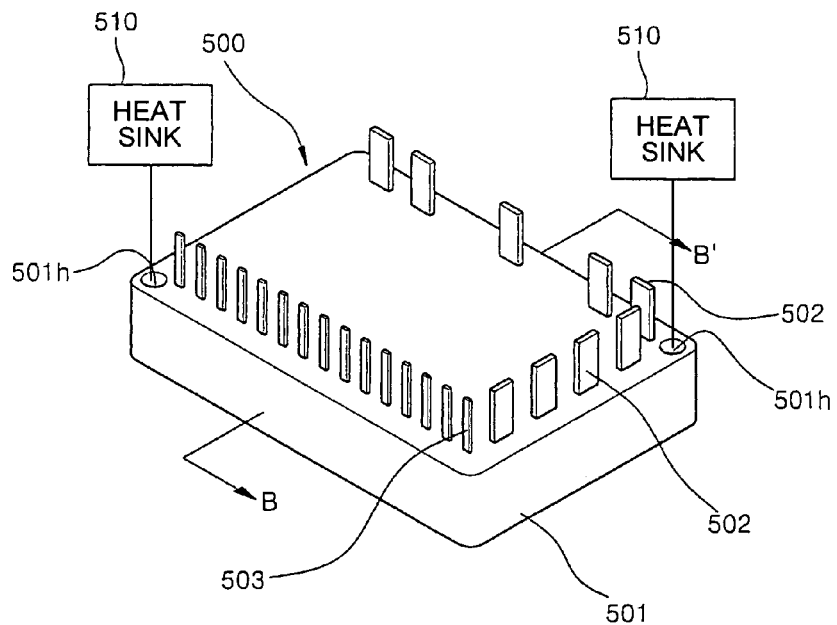
FIG. 5 is a perspective view illustrating an outer appearance of one system module for an electric/electronic appliance in accordance with an embodiment of the present invention.
Figure 6:
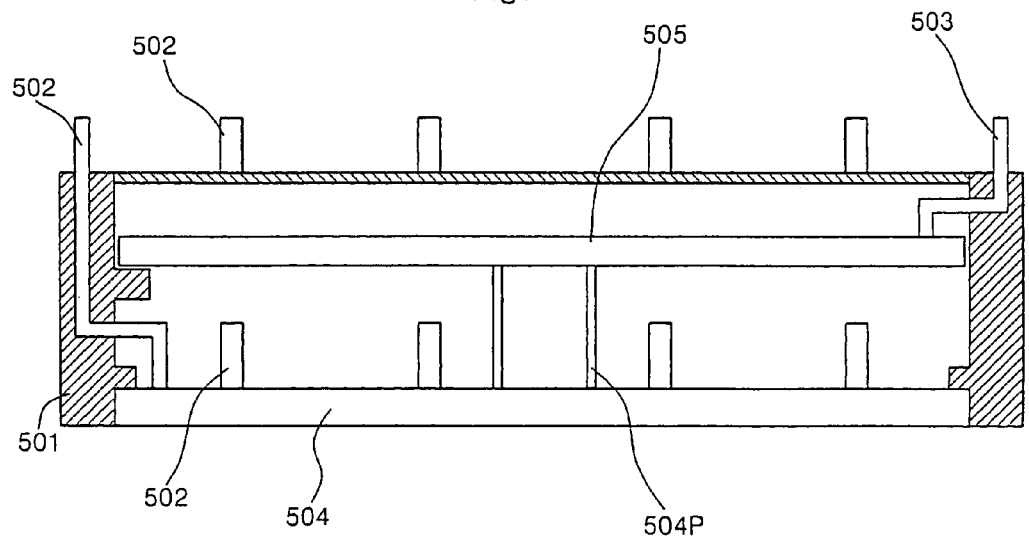
FIG. 6 is a cross-sectional view taken along the line B- B' of FIG. 5.

Referring to FIGS. 5 and 6, one system module 500 for an electric/electronic appliance in accordance with an embodiment of the present invention includes a case 501 which constitutes a body of the one system module 500, power pins 502 and signal pins 503 which are disposed adjacent to three edges on a surface of the case 501 in a manner such that substantially a U-shaped arrangement is obtained, a power board 504 which is located inside the case 501 and electrically connected with the power pins 502, and a signal board 505 which is located inside the case 501 and electrically connected with the signal pins 503. Here, in the preferred embodiment of the present invention, at least two corner portions among four corner portions of the case 501, which two corner portions are opposite to each other in a diagonal direction, are defined with engaging holes 501h, respectively, through which the case 501 and a heat sink 510 are coupled with each other. Moreover, a plurality of connecting pins 504p are formed on the power board 504 so as to electrically connect the power board 504 and the signal board 505 with each other, and a plurality of inserting holes through which the connecting pins 504p are inserted, respectively, are defined in the signal board 505. In this regard, a person skill in the art will readily recognize that the connecting pins 504p and the inserting holes can be formed and defined vice versa. Namely, the connecting pins 504p can be formed on the signal board 505, and the inserting holes can be defined in the power board 504.

Among the plurality of power pins 502, five pins which are arranged adjacent to one long edge on the surface of the case 501, comprise three phase U, V and W pins (inward placed three pins) which are connected to a motor, and a plus pin and a minus pin (outward placed two pins) for receiving DC link voltage (for example, 310V). Also, among the plurality of power pins 502, four pins which are arranged adjacent to a short edge on the surface of the case 502, are used for power supply.

As described above, by the one system module for an electric/electronic appliance according to the present invention, since power pins and signal pins are disposed adjacent to three edges on a surface of a case to obtain substantially a U-shaped configuration, other than in the conventional art, an entire size of the one system module can be reduced, and when the one system module is applied to an appliance, assemblage of the appliance is improved.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. One system module for an electric/electronic appliance, comprising:

a case having a shape that is substantially parallelepiped, the case constituting a body of the one system module;

a plurality of power pins disposed along each of a first edge and a second edge on an upper surface of the case, and a plurality of signal pins disposed adjacently to a third edge on the upper surface of the case, the third edge being substantially parallel to the first edge and being substantially perpendicular to the second edge, the power pins and the signal pins being arranged in a manner such that substantially a U-shaped arrangement is obtained along the three edges of the upper surface of the case;

a power board located inside the case and electrically connected with the power pins; and a signal board located inside the case and electrically connected with the signal pins, wherein the power pins and the signal pins are sharply protruded from the upper surface of the case, and wherein the power pins include three phase U, V, and W pins being inwardly placed and a plus pin and a minus pins being outwardly placed, such that the three phase U, V, and W pins are provided for connection to a motor, and the plus pin and the minus pin are provided for receiving a DC link voltage.

2. The one system module as claimed in claim 1, wherein at least two corner portions among four corner portions of the case, which two corner portions are opposite to each other in a diagonal direction, are defined with engaging holes, respectively, through which the case and a heat sink are coupled with each other.

3. The one system module as claimed in claim 1, wherein connecting pins and inserting holes through which the connecting pins are inserted, respectively, are complementarily formed and defined on and in the power board and the signal board, so as to electrically connect the power board and the signal board with each other.

4. The module of claim 1, wherein the first edge and the third edge are substantially equal in length.

5. The module according to claim 1, wherein the first edge and the third edge are substantially equal in length.

* * * * *